US010643946B2

(12) United States Patent
Naskar et al.

(10) Patent No.: US 10,643,946 B2
(45) Date of Patent: May 5, 2020

(54) NITROGEN ASSISTED OXIDE GAPFILL

(71) Applicant: Intel Corporation, Santa Clara, CA (US)

(72) Inventors: Sudipto Naskar, Portland, OR (US); Manish Chandhok, Beaverton, OR (US); Kevin L. Lin, Beaverton, OR (US); Ryan Pearce, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/015,704

(22) Filed: Jun. 22, 2018

(65) Prior Publication Data

US 2019/0393151 A1 Dec. 26, 2019

(51) Int. Cl.
| | | |
|---|---|---|
| *H01L 23/532* | (2006.01) | |
| *H01L 23/528* | (2006.01) | |
| *H01L 21/768* | (2006.01) | |
| *H01L 27/118* | (2006.01) | |
| *H01L 23/522* | (2006.01) | |
| *H01L 23/52* | (2006.01) | |
| *H01L 23/535* | (2006.01) | |

(52) U.S. Cl.
CPC .... *H01L 23/5329* (2013.01); *H01L 21/76837* (2013.01); *H01L 23/52* (2013.01); *H01L 23/5226* (2013.01); *H01L 23/5283* (2013.01); *H01L 23/535* (2013.01); *H01L 23/53295* (2013.01); *H01L 27/11803* (2013.01)

(58) Field of Classification Search
CPC . H01L 23/5283; H01L 23/52; H01L 23/5226; H01L 23/5329; H01L 23/53295; H01L 23/535
See application file for complete search history.

(56) References Cited

U.S. PATENT DOCUMENTS

2001/0037458 A1* 11/2001 Kean ................... G06F 12/1408
713/193
2012/0015517 A1* 1/2012 Oshida .............. H01L 21/76883
438/667
2016/0316434 A1* 10/2016 Speth ................ H04W 52/0245

FOREIGN PATENT DOCUMENTS

WO PCT/US2016/054461 * 9/2016
WO 2017099701 A1 6/2017

* cited by examiner

*Primary Examiner* — Feifei Yeung Lopez
(74) *Attorney, Agent, or Firm* — Trop, Pruner & Hu, P.C.

(57) ABSTRACT

An embodiment includes a dielectric material; a trench included in the dielectric material, the trench having first and second opposing sidewalls; wherein the trench includes: (a)(i) a first trench portion extending from the first sidewall to the second sidewall, (a)(ii) a second trench portion extending from the first sidewall to the second sidewall, and (a)(iii) a third trench portion extending from the first sidewall to the second sidewall; wherein the second trench portion is between the first trench portion and the third trench portion; wherein the first trench portion is substantially filled with a first material, the second trench portion is substantially filled with a second material, and the third trench portion is substantially filled with a third material; wherein (b)(i) the first material includes nitrogen, and (b)(ii) the first material includes more nitrogen than the third material. Other embodiments are described herein.

20 Claims, 11 Drawing Sheets

NITROGEN ASSISTED OXIDE GAPFILL

TECHNICAL FIELD

Embodiments of the invention are in the field of semiconductor devices.

BACKGROUND

Once semiconductor wafers are prepared, a large number of process steps are still necessary to produce desired semiconductor integrated circuits. In general the steps can be grouped into four areas: Front End Processing, Back End Processing, Test, and Packaging.

Front End Processing (sometimes referred to as "frontend") refers to the initial steps in the fabrication. In this stage the actual semiconductor devices (e.g., transistors) are created. A typical front end process includes: preparation of the wafer surface, patterning and subsequent implantation of dopants to obtain desired electrical properties, growth or deposition of a gate dielectric, and growth or deposition of insulating materials to isolate neighboring devices.

Once the semiconductor devices have been created they must be interconnected to form the desired electrical circuits. This "Back End Processing" (sometimes referred to as "backend") involves depositing various layers of metal and insulating material in the desired pattern. Typically the metal layers consist of aluminum, copper, and the like. The insulating material may include oxides, low-K materials, and the like. The various metal layers are interconnected by interconnects, which may include a line portion (sometimes referred to as a trace or wire) and a via portion. Vias may be formed by etching holes in the insulating material and depositing metal (e.g., Tungsten) in them. The line portion may be formed by etching trenches in the insulating material and depositing metal in them.

Once the Back End Processing has been completed, the semiconductor devices are subjected to a variety of electrical tests to determine if they function properly. Finally, the wafer is cut into individual die, which are then packaged in packages (e.g., ceramic or plastic packages) with pins or other connectors to other circuits, power sources, and the like.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments (e.g., walls may not be exactly orthogonal to one another in actual fabricated devices). Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

In many cases the processing that occurs in the front end or back end includes forming a trench within a dielectric material. Parts of these trenches may be filled with metal to form traces, vias, and more generally, interconnects. Other parts of the trenches may be filled with "gapfill" materials such as an oxide (e.g., silicon oxide), nitride, or carbide. Applicant determined that gapfilling trenches with a high aspect ratio (e.g., greater than or equal to 2:1 height:width) can be problematic due to a propensity for gapfill materials to form a seam or void where the materials growing from opposing trench sidewalls meet one another. This problem is exacerbated when the trench has a tight pitch (e.g., width between sidewalls is 20 nm or less) and/or a re-entrant trench profile. An example of a reentrant profile is shown in FIG. 1.

Figure 1:
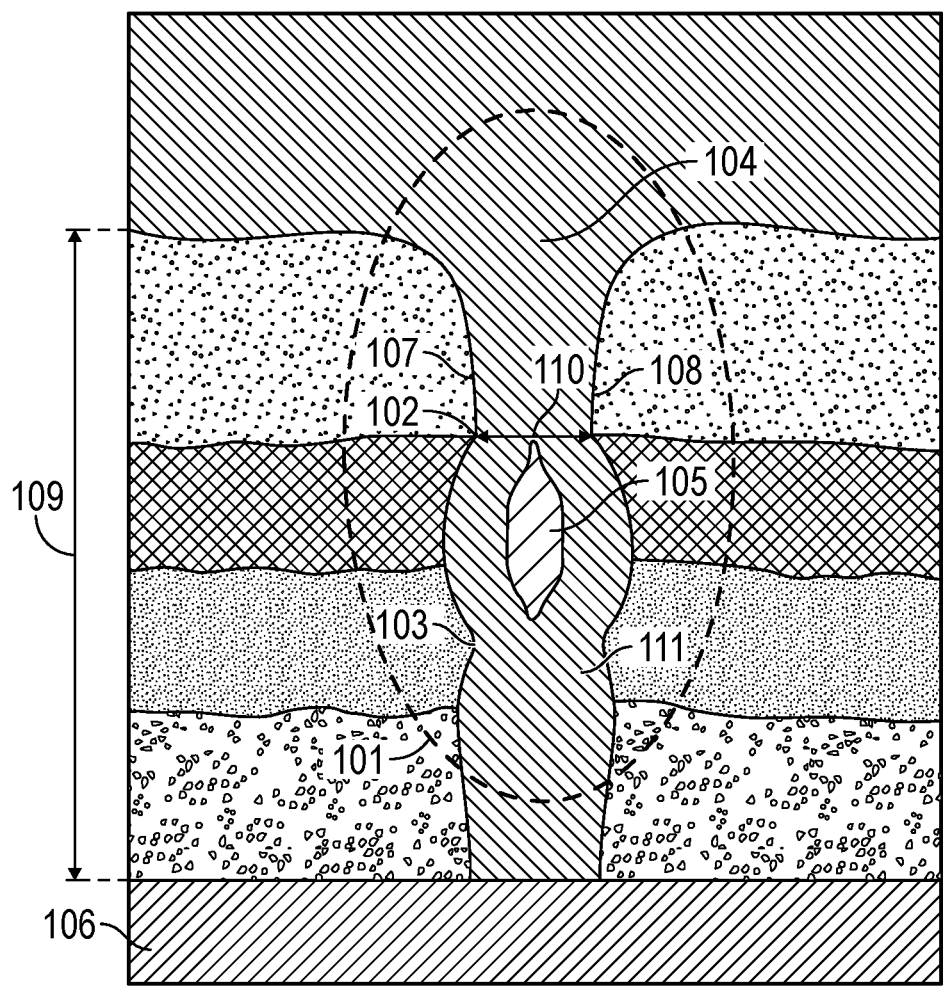
FIG. 1 depicts a reentrant trench with a void.

In FIG. 1, trench 101 is formed above substrate layer 106 and traverses numerous layers of material. Layer 106 may be a wafer in the front end of an integrated circuit system or some dielectric layer in a back end of an integrated circuit system. Trench 101 includes an opening 104 and opposing sidewalls 107, 108. Trench 101 includes an aspect ratio (height 109:width 110) of about 10:1. (Note drawings addressed herein may not be to scale.) Width 110 is the narrowest portion of the trench. Trench 101 is considered "reentrant" due to the narrowed portions that result in decreased trench widths (see narrowing at point 102 and/or 103), which are above a broader width (i.e., there is a narrower width between the trench opening and a broader width). As gapfill material 111 grows in a conformal layer (e.g., from atomic layer deposition, ALD) from sidewalls 107, 108 the material forms void 105. As metal vias are later formed in trench 101 a short circuit condition may exist if the metal from the via unintentionally traverses void 105 and interacts with another portion of the integrated circuit. In other words, these seams and voids may form a shorting path between different transistors and/or interconnects leading to device failure.

To address the formation of voids and seems, a conventional technique utilizes flowable precursors. For example, a flowable gapfill may involve depositing a soft jelly-like liquid or flowable film into a trench and then converting the flowable film into a solid silicon oxide film. However, a drawback of using flowable materials is the difficulty to cure the material inside deep trenches. This failure to fully and consistently cure the gapfill material leads to variable material properties (e.g., mechanical, compositional and electrical) inside the trench. Also, the flowable materials generally lack mechanical strength.

To address the formation of voids and seams, another conventional technique utilizes a deposition step, followed by an etch step, followed by another deposition step (a "Dep-Etch-Dep" reaction sequence). This Dep-Etch-Dep reaction sequence may be repeated in an effort to achieve a void-free fill. The etch step etches the upper corners of the first deposited film more than the film portion deposited on the sidewalls and lower portion of the gap, thereby widening the gap and enabling the subsequent deposition step to fill the gap without prematurely closing it off. However, a drawback for the "Dep-Etch-Dep" approach is the increased complexity of the integration scheme by adding extra deposition and etch steps. In the case of variable pitch scales (e.g., where the pitch between patterns varies within a layer of a device), the number of cycles of "Dep-Etch-Dep" also increases thereby increasing the difficulty of process control and lowering the run-rate of the process.

In contrast to the above described problematic conventional techniques, an embodiment includes depositing a silicon oxide gapfill material into a trench using ALD (or some other deposition technique in other embodiments). More specifically, a trench of an incoming substrate is exposed to a silicon precursor and then to an oxidizing agent. The resultant oxidized material is then exposed to a nitrogen plasma. By doing so the oxidized material near the top of the trench is passivated by the nitrogen. The passivation is substantially restricted to the upper trench sidewalls due to, for example, the short mean free path of the nitrogen (i.e., the nitrogen is fully consumed by the upper portion of the trench and never gets to the bottom of the trench). The mean free path is the average distance that a particle can travel between two successive collisions with other particles. Afterwards additional silicon precursor is applied within the trench. However, the passivated upper portion of the trench partially prevents the sorption (both physisorption, which entails adsorption in which the adsorbed substance is held by physical bonds such as van der Waals forces, as well as chemisorption, which entails adsorption in which the adsorbed substance is held by chemical bonds) of the silicon precursor to the surface in the following cycle. Because this passivation phenomenon is substantially restricted to the top of the trench sidewall, a deposition rate gradient is created along the depth of the trench with a higher deposition rate (e.g., deposition rate of silicon oxide) at the bottom of the trench.

This technique enables a void free preferentially bottom-up gapfill (e.g., silicon oxide) process that is effective for re-entrant trench profiles and/or trenches with minimum widths as low as 10 nm (or lower) and aspect ratios ranging from 2:1 to 10:1 or more, such as 3:1, 5:1, 7:1, and 9:1.

Figure 2:
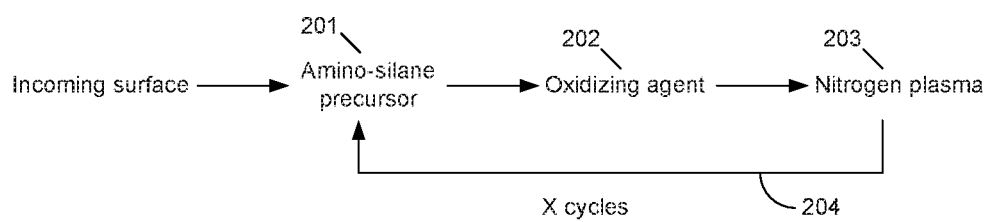
FIG. 2 includes a process in an embodiment.

FIG. 2 includes method 200. For a silicon oxide ALD process, an amino-silane precursor is applied or coupled to a surface, such as the sidewalls and bottom of a trench formed in a dielectric material (see action 201). Embodiments utilize amino silane precursors such as, for example, BTBAS (Bis(tert)-butyl amino silane), TDMAS (Tris(dimethyl) amino silane), DIPAS (Di(isopropyl) amino silane), DSBAS (Di(sec-butyl) amino silane), BDEAS (Bis(diethyl) amino silane), and combinations thereof. However, other embodiments more generally use silicon based precursors. One such silicon based precursor includes a silane precursor, but other silicon based precursors may be used.

The amino-silane precursor is then sequentially reacted with an oxidizing agent like ozone ($O_3$), hydrogen peroxide ($H_2O_2$), and combinations thereof (see action 202).

If additional silicon precursor (e.g., amino-silane) were to be applied to the oxidized product of action 202, the deposition of silicon along the sidewalls of the trench may cause a seam or void, which is even more likely if the trench includes a reentrant profile (which tapers inwards as the sidewalls move upwards towards the trench opening). However, an embodiment supplies a nitrogen plasma (see action 203) before any additional silicon precursor (see action 204) is applied to the oxidized product of action 202.

The addition of nitrogen plasma is effective because the general ALD process of filling the gap (e.g., trench or other void) with silicon oxide is highly dependent on the chemisorption of the amino silane precursor to an —H and/or —OH terminated surface that exists due to the oxidation process of action 202. In the case of a non-hydrogen terminated surface, the addition of silicon oxide proceeds at a very slow rate mostly depending on other forms of a surface binding mechanism (e.g., addition of silicon oxide to the sidewall based on dangling bonds). Thus, when the deposited oxide monolayer from each deposition cycle is subjected to nitrogen plasma, the surface hydrogen atoms are removed resulting in limited number of binding sites for the amino silane precursor. As a result, there are fewer binding sites near the top of the trench so the sidewalls grow, but grow more slowly than the sidewall near the bottom of the trench where less or no nitrogen passivation occurs.

Figure 3:
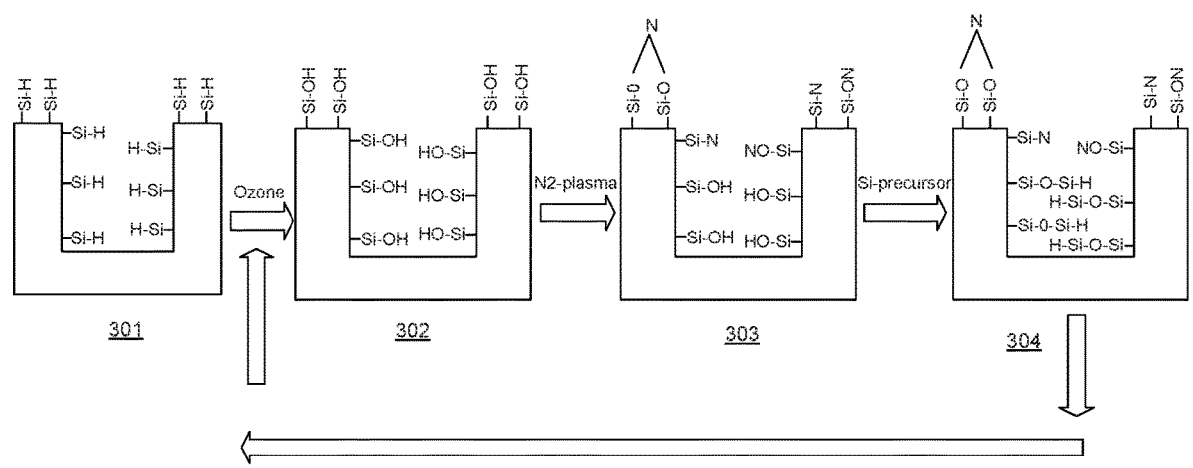
FIG. 3 includes a process in an embodiment.

FIG. 3 provides a more detailed illustration of the process described generally in FIG. 2. Process 300 begins with stage 301, where silicon precursor chemisorbs to the surface of the substrate with a hydrogen termination. The substrate may be a wafer (e.g., silicon) or a dielectric (e.g., oxide, nitride, carbide). At stage 302 ozone oxidation of the silicon precursor forms an —OH termination of the trench surface. At stage 303 nitrogen plasma results in —N terminated surface portions along the top of the trench (i.e., the —H termination is removed preferentially from the top of the trench). Again, this is due to the short mean free path for nitrogen (i.e., the $N_2$ ionic species generated in the $N_2$ plasma recombines quickly and consequently has relatively less penetration to the bottom of the trench). As the process starts to repeat with the addition of more silicon precursor at stage 304, the silicon precursor selectively chemisorbs to the H-terminated surfaces but not the —N terminated surfaces. Thus, the shallowness of nitrogen plasma preferentially passivates the top of the trench leading to preferential deposition of silicon oxide film closer to the bottom of the trench. So even with a narrowed top of the trench (not shown in FIG. 3), voids and seams are avoided or lessened.

In an embodiment, as additional layers are added to fill the trench nitrogen from previous layers stays embedded in the film. The bonds that are satisfied by nitrogen remain passivated.

Figure 4:
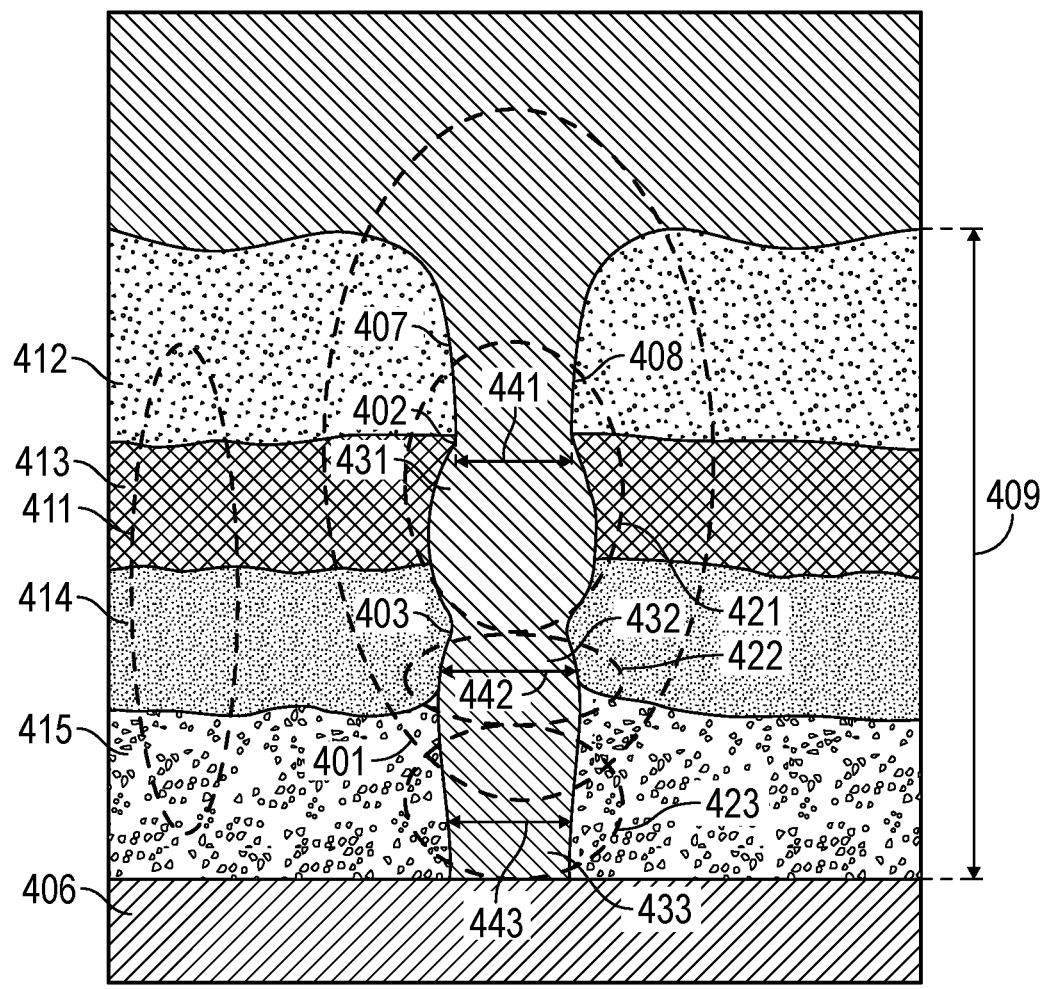
FIG. 4 includes a gapfilled trench in an embodiment.

FIG. 4 includes an integrated circuit system comprising a dielectric material 411. The material may be composed of layers 412, 413, 414, 415. The dielectric material may be on another system component 406, which may be a wafer or layer in a back end. Trench 401 is included in the dielectric material. Trench 401 has first and second opposing sidewalls 407, 408. The trench includes a first trench portion 421 extending from the first sidewall to the second sidewall, a second trench portion 422 extending from the first sidewall to the second sidewall, and a third trench portion 423 extending from the first sidewall to the second sidewall. The first trench portion is substantially filled with a first material 431, the second trench portion is substantially filled with a second material 432, and the third trench portion is substantially filled with a third material 433. The first material 431 includes nitrogen, and the first material includes more nitrogen than the third material. For example, the third material may include no nitrogen or may simply have an atomic mass percent of nitrogen that is less than the atomic mass percent of nitrogen for the first material.

For example, in an embodiment the first material 431 includes a first atomic weight percentage of nitrogen; the third material 433 includes a third atomic weight percentage of nitrogen; and the first atomic weight percentage of nitrogen is greater than the third atomic weight percentage of nitrogen. For instance, the first atomic weight percentage of nitrogen is between 5.0% and 9.0%; and the third atomic weight percentage of nitrogen is between 0% and 4.9%. In other embodiments the first atomic weight percentage may be 5, 10, 15, 20% or higher and the third atomic weight percentage may be 1, 3, 5, 7% or higher.

In an embodiment the first material 431 further includes silicon and oxygen (primarily, as well as trace elements such as hydrogen), the second material 432 includes silicon and oxygen (primarily, as well as trace elements such as hydrogen), and the third material 433 includes silicon and oxygen (primarily, as well as trace elements such as hydrogen).

FIG. 4 presents a reentrant trench profile. For example, the first trench portion includes a first width 441, the second trench portion includes a second width 442, the third trench portion includes a third width 443; and the first width 441 is less than the third width 443. As explained above, such a profile is problematic because the narrowed width 441 (see narrowing at point 402) will cause conformal layers on the sidewalls 407, 408 to meet before the conformal sidewalls at other locations such as width 442. This typically causes a void or weakened seam. However, due to the differential deposition rate due to nitrogen passivation, the third portion 423 gapfill will be formed more quickly than the first portion 421 gapfill. This reduces the chances of a seam and/or void being formed. A reentrant profile does not absolutely require that the narrowest portion of the trench is at the top of the trench. See, for example, the narrowing at point 403.

Figure 5:
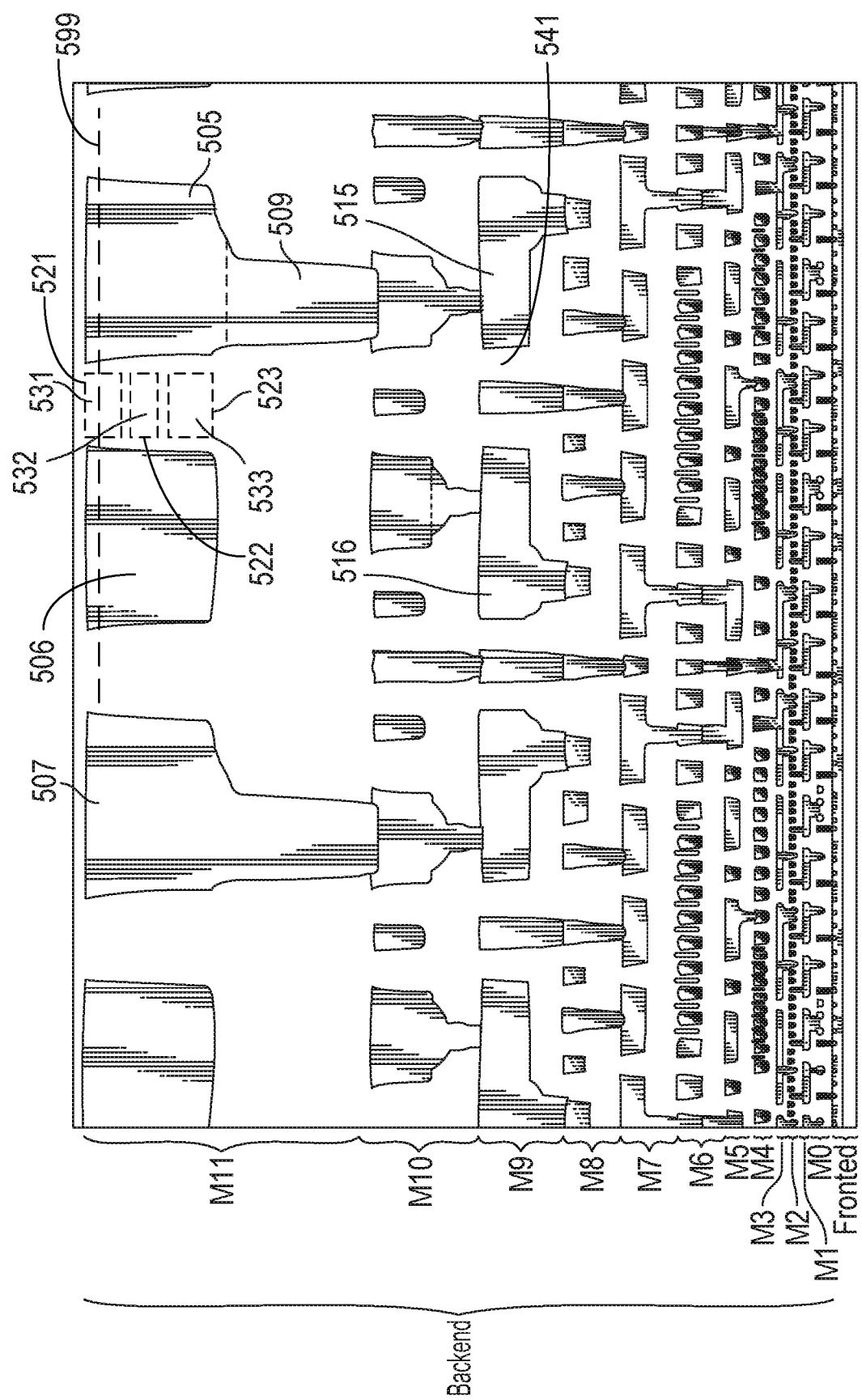
FIG. 5 includes a back end including embodiments of gapfilled trenches.

FIG. 5 depicts a device backend with numerous metallization layers. The back end is above the front end. The back end includes metal layers M0, M1, M2, M3, M4, M5, M6, M7, M8, M9, M10, M11. Metal interconnect 505 is above via 509. Interconnect 505 may be one of several interconnects (such as interconnects 506 and 507) formed from a single trench region. Different interconnects 505, 506 may be separated by a gapfill material used to fill the trench either before or after formation of interconnects 505, 506. Interconnects 505, 506 may be traces, wires (e.g., see traces 515, 516 separated by gapfill material 541), contacts, and the like. FIG. 5 presents a side view of a trench (albeit a filled trench) whereas FIG. 4 presents a cross-section of a trench. In FIG. 5 a first trench portion 521 is above a second trench portion 522, which is above a third trench portion 523. The first trench portion is substantially filled with a first material 531, the second trench portion is substantially filled with a second material 532, and the third trench portion is substantially filled with a third material 533. The first material 531 includes nitrogen, and the first material includes more nitrogen than the third material. For example, the third material may include no nitrogen or may simply have an atomic mass percent of nitrogen that is less than the atomic mass percent of nitrogen for the first material. An axis 599 orthogonal to the first width of the trench (not shown in this view) intersects the first gapfill material 531 and the metal of interconnects 506, 507.

Figure 6:
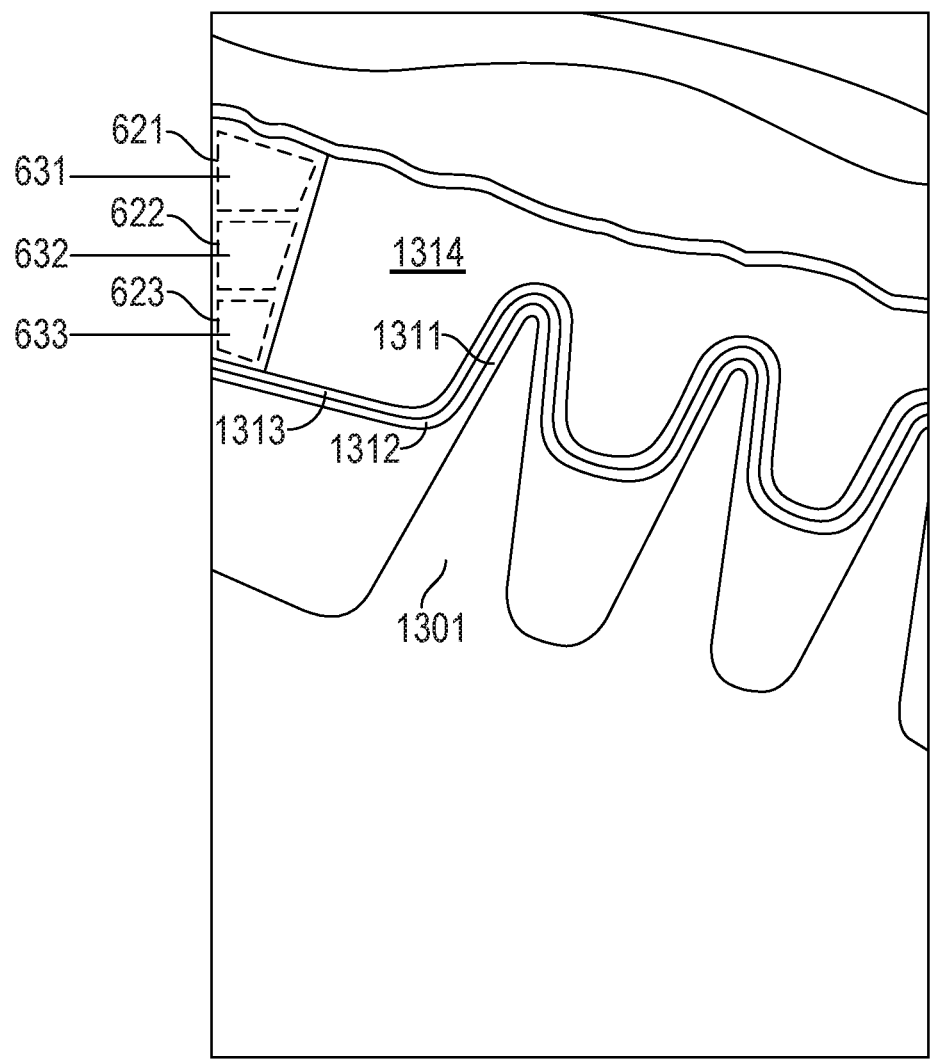
FIG. 6 includes a front end including embodiments of gapfilled trenches.

FIG. 6 depicts a device front end. FIG. 6 presents a side view of a gate 1314 above fins (fin 1301 is labeled). The gate was formed in a trench, which also includes gapfill material. In FIG. 6 a first trench portion 621 is above a second trench portion 622, which is above a third trench portion 623. The first trench portion is substantially filled with a first material 631, the second trench portion is substantially filled with a second material 632, and the third trench portion is substantially filled with a third material 633. The first material 631 includes nitrogen, and the first material includes more nitrogen than the third material. For example, the third material may include no nitrogen or may simply have an atomic mass percent of nitrogen that is less than the atomic mass percent of nitrogen for the first material. Other materials and layers (e.g., layers 1311, 1312, 1313) may be present but are not discussed to maintain focus on the relationship between the gapfill material and gate 1314.

Comparing FIGS. 5 and 6, FIG. 5 illustrates how a trench in the back end may be gapfilled using embodiments of the nitrogen passivation method described herein while FIG. 6 shows how a trench in the front end (where the trench is used to form a gate) may be gapfilled using embodiments of the nitrogen passivation method described herein.

Returning to FIG. 4, the trench includes an aspect ratio defined by a ratio of a depth of the trench 409 to the third width 443. In an embodiment the aspect ratio is at least 4:1 but in other embodiments the aspect ratio may be 3:1, 5:1, 6:1, 7:1, 8:1, 9:1 or higher. In an embodiment the third width 433 is between 15 nm and 80 nm and the depth 409 is between 60 nm and 320 nm.

Figure 7:
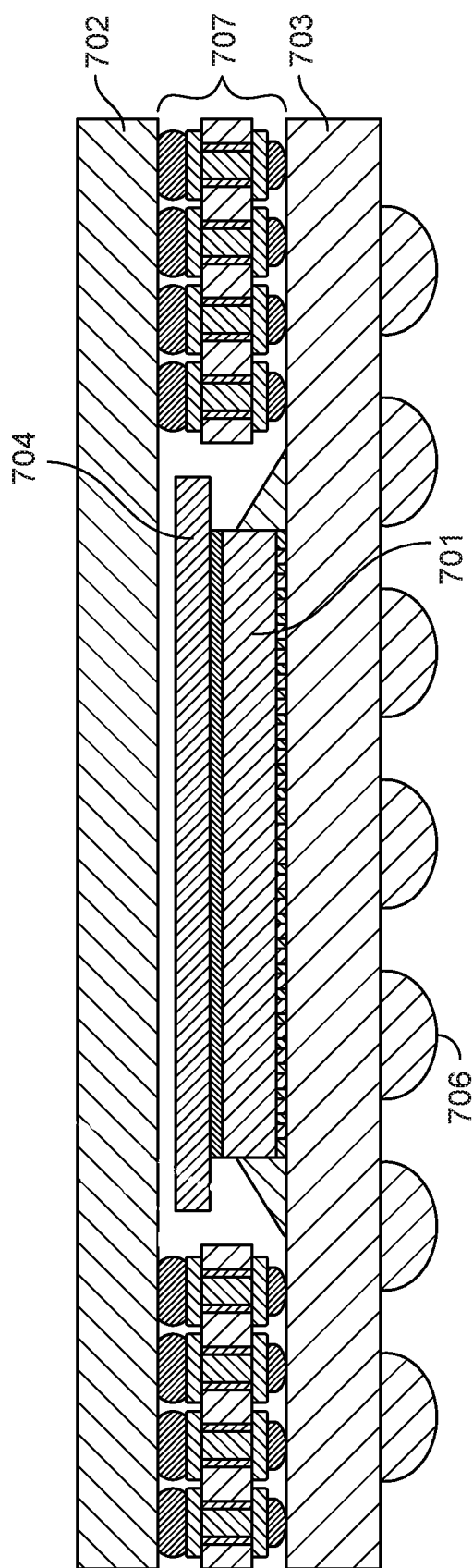
FIG. 7 includes a package including embodiments of gapfilled trenches.

FIG. 7 includes a package system in an embodiment. The system includes a processor die 701 (a first package) on a package substrate 703. A memory die (a second package) 702 couples to the substrate 703 by way of interposer system 707. Underfill material 716 exists between die 701 and substrate 703. Substrate 703 may include controlled collapse chip connection (C4) interconnects 706. Further, to prevent warping of die 701, die 701 may couple to a metal stiffener 704. Die 701 may include a die stack (e.g., multiple dies which may have the same function or differing functions) that may be molded as one unit that functions as a single die. For example, one die of the stack may have a first logic function while another die of the stack has another logic function that differs from the first logic function.

In the embodiment of FIG. 7, die 701 includes a gapfilled trench such as the trenches of any of FIGS. 4-6, 11. In another embodiment die 702 includes a gapfilled trench such as the trenches of any of FIGS. 4-6, 11. In an embodiment die 701 includes gapfilled trench such as the trenches of any of FIGS. 4-6, 11 and die 702 includes a gapfilled trench such as the trenches of any of FIGS. 4-6, 11.

In an embodiment element 704 is not a stiffener but instead is a heat spreader (or is both a stiffener and a heat spreader). A heat spreader is a heat exchanger that moves heat between a heat source and a secondary heat exchanger whose surface area and geometry are more favorable than the source. Such a spreader may be a plate made of copper, which has a high thermal conductivity. By definition, heat is "spread out" over this geometry, so that the secondary heat exchanger may be more fully utilized. This has the potential to increase the heat capacity of the total assembly.

Thus, FIG. 7 depicts an integrated circuit, a memory, and a package housing that includes the integrated circuit and the memory. The integrated circuit includes a trench with gapfill materials such as any of the trenches of FIGS. 4-6, 11. For example, the circuit may be a processor with gapfilled voids or trenches located in the back end or front end of the processor. For example, the circuit may be a field programmable gate array (FPGA) with gapfilled voids or trenches located in the back end or front end of the FPGA. In other embodiments, the memory (in addition to the integrated circuit or instead of the integrated circuit) includes a trench with gapfill materials such as any of the trenches of FIGS. 4-6, 11.

Figure 11:
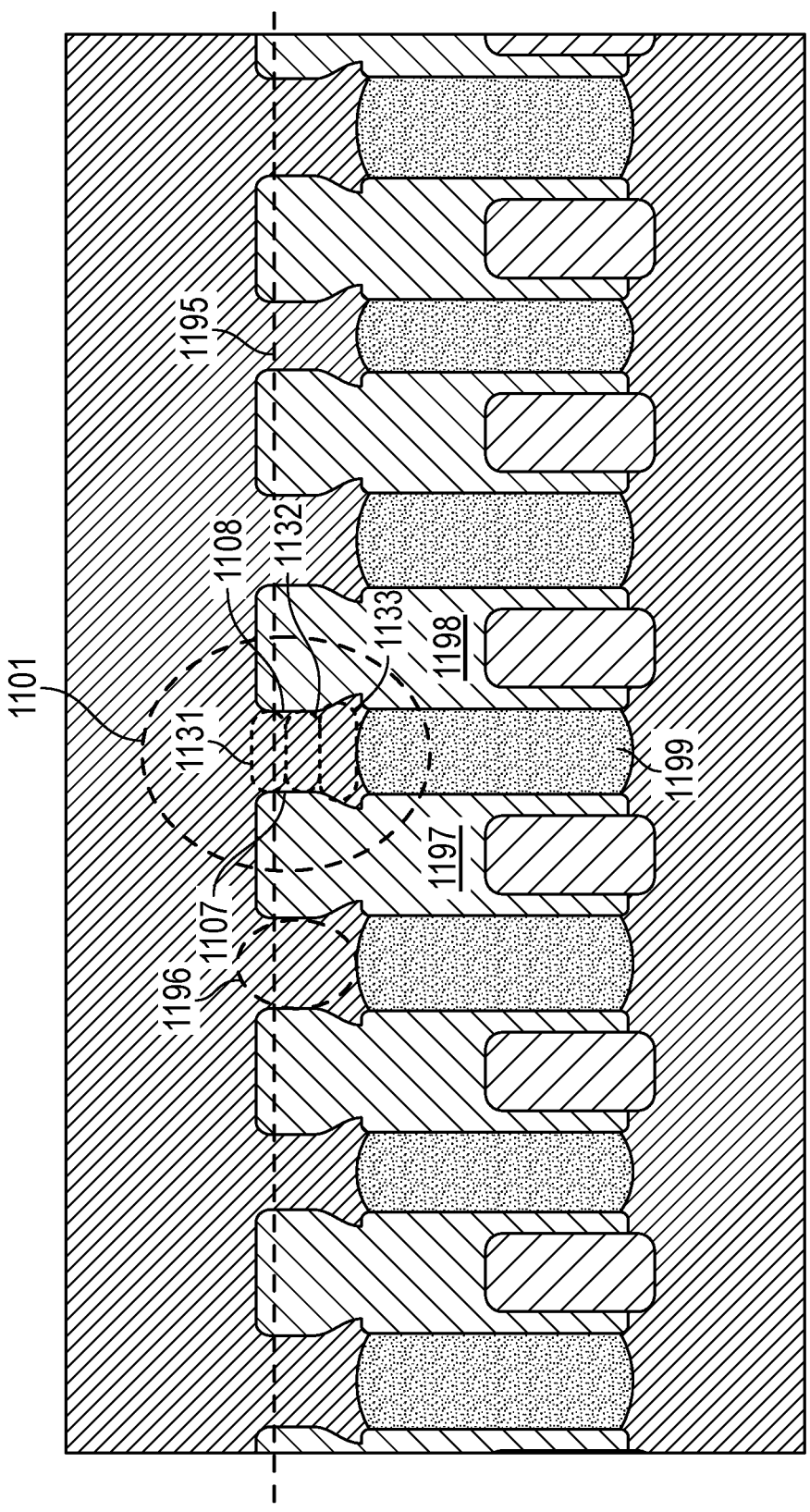
FIG. 11 includes a back end including embodiments of gapfilled trenches.

FIG. 11 includes an integrated circuit system comprising trench 1101 included in a dielectric material. Trench 1101 has first and second opposing sidewalls 1107, 1108 that taper towards each other near the opening of the trench. The trench includes a first trench portion extending from the first sidewall to the second sidewall, a second trench portion extending from the first sidewall to the second sidewall, and a third trench portion extending from the first sidewall to the second sidewall. The first trench portion is substantially filled with a first material 1131, the second trench portion is substantially filled with a second material 1132, and the third trench portion is substantially filled with a third material 1133. The first material 1131 includes nitrogen, and the first material includes more nitrogen than the third material. For example, the third material may include no nitrogen or may simply have an atomic mass percent of nitrogen that is less than the atomic mass percent of nitrogen for the first material.

The trench may be above gate 1199. In such an instance the trench may provide a gate cap. The gate cap may facilitate self-aligned contact (SAC) formation by providing protection (temporary or permanent) for gate 1199 during contact (e.g., source or drain contact) processing. Gate 1199 may be between dielectric portions (e.g., spacers) 1197, 1198. Further, area 1196 may include metal (e.g., for a source or drain contact). Thus, axis 1195 (parallel to a width of trench 1101) intersects the first material 1131 and the additional metal (which would be in area 1196). The additional metal for the SAC may go beyond area 1196 (not shown) but may at least be partially included in area 1196.

FIG. 11 addresses use of different hard mask materials for self-aligned features for multiple passes of plug and via patterning. FIG. 11 has an incoming re-entrant profile that will typically lead. However, nitrogen passivation helps avoid the void. A void free hard mask (e.g., gate cap) for SAC will provide improved etch selectivity and promote system reliability by avoid short circuits and/or burdensome etch techniques and/or flowable materials that are difficult to cure.

Figure 8:
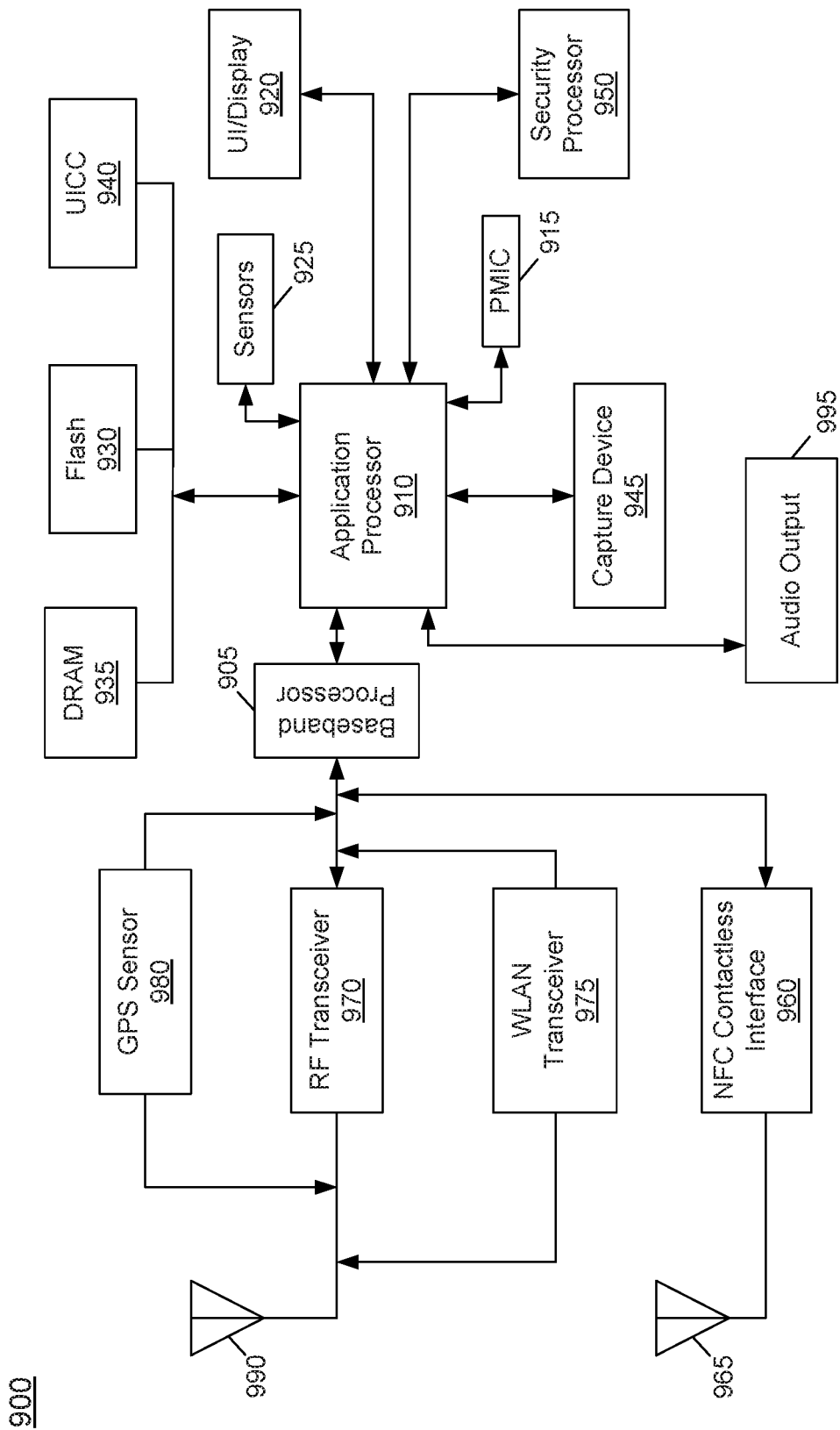
FIGS. 8, 9, 10 include systems that include embodiments.

Referring now to FIG. 8, shown is a block diagram of an example system with which embodiments can be used. As seen, system 900 may be a smartphone or other wireless communicator or any other Internet of Things (IoT) device. A baseband processor 905 (which may include gapfilled trenches described herein) is configured to perform various signal processing with regard to communication signals to be transmitted from or received by the system. In turn, baseband processor 905 is coupled to an application processor 910, which may be a main CPU (which may include gapfilled trenches described herein) of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display) (which may include gapfilled trenches described herein). In addition, application processor 910 may couple to a memory system including a non-volatile memory (which may include gapfilled trenches described herein), namely a flash memory 930 and a system memory, namely a DRAM 935. As further seen, application processor 910 also couples to audio output 995 and a capture device 945 such as one or more image capture devices that can record video and/or still images.

A universal integrated circuit card (UICC) 940 (which may include gapfilled trenches described herein) comprises a subscriber identity module, which in some embodiments includes a secure storage to store secure user information. System 900 may further include a security processor 950 (e.g., Trusted Platform Module (TPM)) (which may include gapfilled trenches described herein) that may couple to application processor 910. A plurality of sensors 925 (which may include gapfilled trenches described herein), including one or more multi-axis accelerometers may couple to application processor 910 to enable input of a variety of sensed information such as motion and other environmental information. In addition, one or more authentication devices may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may include gapfilled trenches described herein) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more internet of things (IoT) networks, various circuitry may be coupled between baseband processor 905 and an antenna 990. Specifically, a radio frequency (RF) transceiver 970 (which may include gapfilled trenches described herein) and a wireless local area network (WLAN) transceiver 975 (which may include gapfilled trenches described herein) may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 (which may include gapfilled trenches described herein) may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 9:
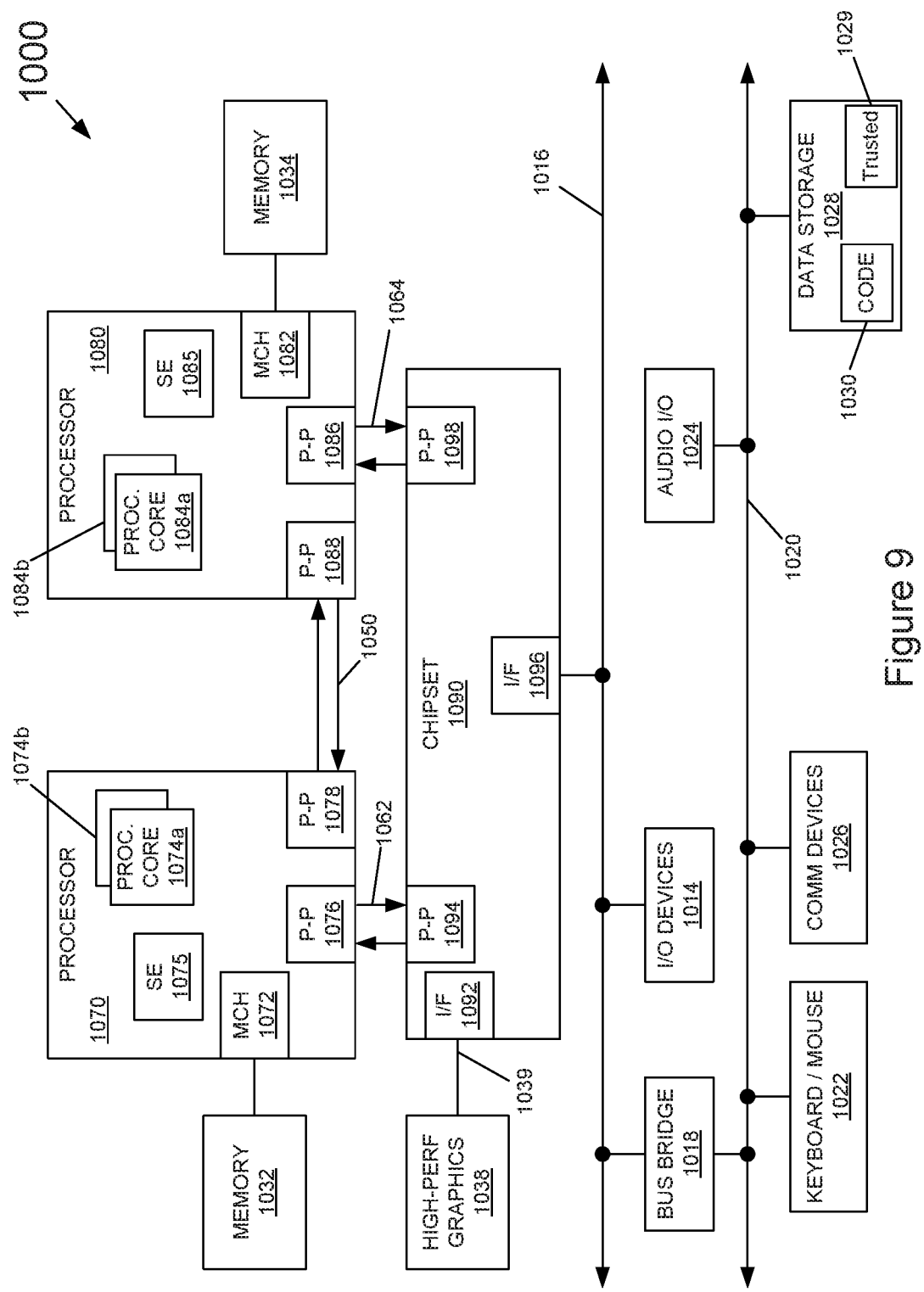

Referring now to FIG. 9, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors (which may include gapfilled trenches described herein) such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 (which may include gapfilled trenches described herein) via P-P interconnects 1062 and 1064, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 (which may include gapfilled trenches described herein) such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Figure 10:
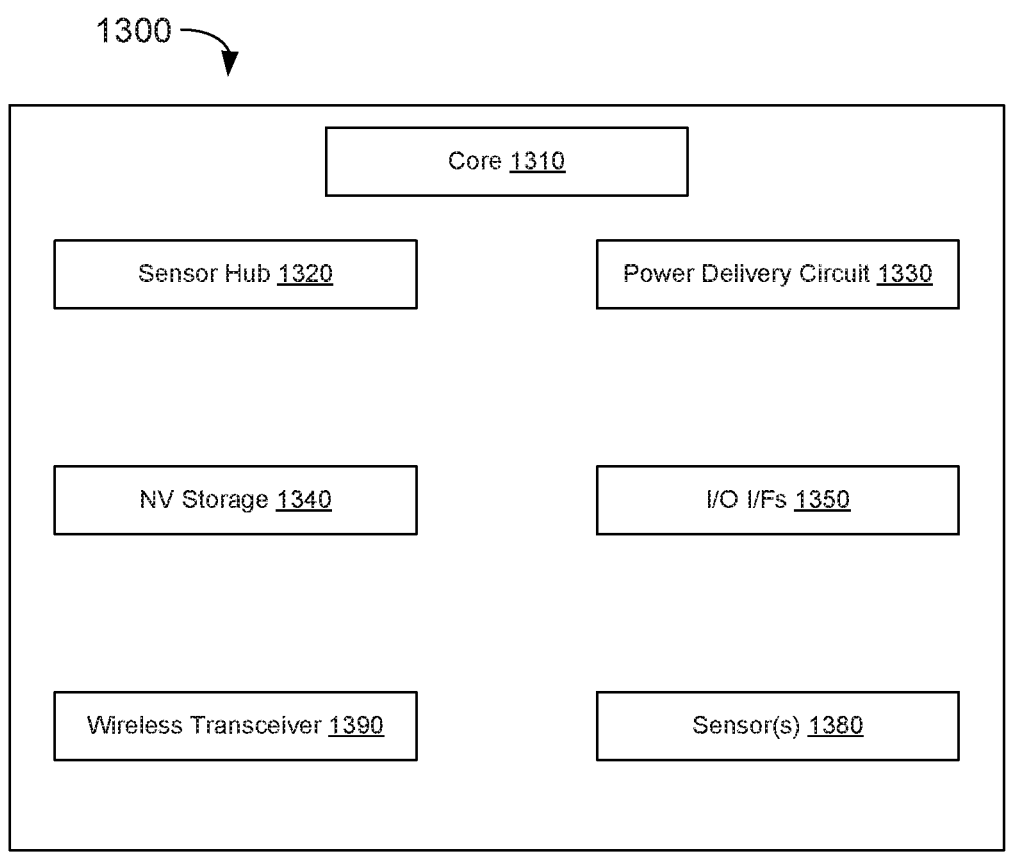

Referring now to FIG. 10, embodiments may be used in environments where IoT devices may include wearable devices or other small form factor IoT devices. Shown is a block diagram of a wearable module 1300 in accordance with another embodiment. In one particular implementation, module 1300 (which may include gapfilled trenches described herein) may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a Trusted Execution Environment (TEE). Core 1310 couples to various components including a sensor hub 1320 (which may include gapfilled trenches described herein), which may be configured to interact with a plurality of sensors 1380, such as one or more biometric, motion environmental or other sensors. A power delivery circuit 1330 (which may include gapfilled trenches described herein) is present, along with a non-volatile storage 1340 (which may include gapfilled trenches described herein). In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1

An integrated circuit system comprising: a dielectric material; a trench included in the dielectric material, the trench having first and second opposing sidewalls; wherein the trench includes: (a)(i) a first trench portion extending from the first sidewall to the second sidewall, (a)(ii) a second trench portion extending from the first sidewall to the second sidewall, and (a)(iii) a third trench portion extending from the first sidewall to the second sidewall; wherein the second trench portion is between the first trench portion and the third trench portion; wherein the first trench portion is substantially filled with a first material, the second trench portion is substantially filled with a second material, and the third trench portion is substantially filled with a third material; wherein (b)(i) the first material includes nitrogen, and (b)(ii) the first material includes more nitrogen than the third material.

Example 2

The system of example 1 wherein: the first trench portion includes a first width, the second trench portion includes a second width, and the third trench portion includes a third width; and the first width is less than the third width.

Example 3

The system of example 2 comprising a metal interconnect, wherein: the trench includes an aspect ratio define by a ratio of a depth to the trench to the third width; the aspect ratio is at least 4:1.

Example 4

The system of example 3 comprising metal, wherein an axis parallel to the third width intersects the first material and the metal.

Another version of Example 4 is as follows: The system of example 3 comprising metal, wherein an axis orthogonal to the first width intersects the first material and the metal.

Example 5

The system of example 4 wherein the metal is included in at least one of a via and a gate of a transistor.

Example 6

The system of example 5 comprising: an integrated circuit; a memory; a package housing that includes the integrated circuit and the memory; wherein the integrated circuit includes the trench.

Example 7

The system of example 6 wherein the integrated circuit comprises a field programmable gate array (FPGA).

Example 8

The system of example 7 comprising a server, the server including the FPGA.

Example 9

The system of example 6 comprising a radiofrequency receiver.

Example 10

The system of example 9 comprising a battery.

Example 11

The system of example 5 comprising: an integrated circuit; a memory; a package housing that includes the integrated circuit and the memory; wherein the memory includes the trench.

Example 12

The system of example 11 wherein the memory includes a NAND gate.

Example 13

The system of example 4 wherein the metal is included in a via.

Example 14

The system of example 4 wherein the metal is included in a gate of a transistor.

Example 15

The system of example 3 wherein the first material further includes silicon and oxygen, the second material includes silicon and oxygen, and the third material includes silicon and oxygen.

Example 16

The system of example 3 wherein: the third width is between 15 nm and 80 nm; the depth is between 60 nm and 320 nm.

In an embodiment the width is between 15 and 30 nm and the depth is between 60 and 100 nm. In an embodiment the width is between 40 and 45 nm and the depth is between 80 and 120 nm. In an embodiment the width is between 15 and 50 nm and the depth is between 60 and 100 nm.

Example 17

The system of example 3 wherein: the first material includes a first atomic weight percentage of nitrogen; the third material includes a third atomic weight percentage of nitrogen; the first atomic weight percentage of nitrogen is greater than the third atomic weight percentage of nitrogen.

Example 18

The system of example 17 wherein: the first atomic weight percentage of nitrogen is between 5% and 20%; the third atomic weight percentage of nitrogen is between 0% and 4.9%.

However, in other embodiments ranges are respectively 10-20% and 0-9.9%; 2-10% and 0-1.9%; and 1-15% and 0-0.9%.

Example 19

The system of example 17 comprising a metal, wherein an axis orthogonal to the third width intersects the first material and the metal.

Example 20

The system of example 19 comprising an additional metal, wherein an axis parallel to the third width intersects the first material and the additional metal.

Example 21

The system of example 3 wherein the first, second, and third materials collectively include a plurality of conformal layers that conform to the first and second sidewalls.

Example 22

A method comprising: forming a trench in a dielectric material, the trench including an opening and first and second sidewalls that oppose one another; exposing the trench to a silane to form a first compound on the first and second sidewalls, the first compound including silicon and hydrogen; exposing the first compound to an oxidizing agent to form a second compound on upper halves of the first and second sidewalls and on lower halves of the first and second sidewalls, the second compound including silicon, oxygen, and hydrogen; exposing the second compound formed on the upper halves of the first and second sidewalls to nitrogen to form a third compound along the upper halves of the first and second sidewalls, the third compound including silicon and nitrogen; exposing the second and third compounds to the silane to form a conformal layer on the upper and lower halves of the first and second sidewalls; wherein the conformal layer includes a first portion formed on the upper halves of the first and second sidewalls and a second portion formed on the lower halves of the first and second sidewalls; wherein the first portion includes a first atomic weight percentage of nitrogen, the second portion includes a second atomic weight percentage of nitrogen, and the first atomic weight percentage of nitrogen is greater than the second atomic weight percentage of nitrogen; wherein the upper halves of the first and second sidewalls are between the opening and the lower halves of the first and second sidewalls.

Example 23

The method of example 22 wherein: the first portion includes a first thickness measured orthogonal to the plane;

the second portion includes a second thickness measured orthogonal to the plane; the first thickness is less than the second thickness.

Example 24

The method of example 23 comprising forming additional conformal layers on the upper and lower halves of the first and second sidewalls; wherein the additional conformal layers collectively include an additional first portion formed on the upper halves of the first and second sidewalls and an additional second portion formed on the lower halves of the first and second sidewalls; wherein the additional first portion includes an additional first atomic weight percentage of nitrogen, the additional second portion includes an additional second atomic weight percentage of nitrogen, and the additional first atomic weight percentage of nitrogen is greater than the additional second atomic weight percentage of nitrogen; wherein the conformal layer and the additional conformal layers collectively substantially fill the trench in a plane, the plane including the upper and lower halves of the first and second sidewalls.

Example 25

The method of example 24 wherein the upper halves of the first and second sidewalls are separated by a first minimum width; wherein the lower halves of the first and second sidewalls are separated by a second minimum width; wherein the first minimum width is less than the second minimum width; wherein the first and second minimum widths are both measured orthogonal to the plane; wherein the method further comprises: (a) including the trench in an integrated circuit, and (b) including the integrated circuit and a memory in a single package.

Example 1a

An integrated circuit system comprising: a dielectric material; a trench included in the dielectric material, the trench having first and second opposing sidewalls; wherein the trench includes: (a)(i) a first trench portion extending from the first sidewall to the second sidewall, (a)(ii) a second trench portion extending from the first sidewall to the second sidewall, and (a)(iii) a third trench portion extending from the first sidewall to the second sidewall; wherein (b)(i) the second trench portion is between the first trench portion and the third trench portion, and (b)(ii) the first trench portion is between an opening of the trench and the second trench portion; wherein the first trench portion is substantially filled with a first material, the second trench portion is substantially filled with a second material, and the third trench portion is substantially filled with a third material; wherein (c)(i) the first material includes nitrogen, and (c)(ii) the first material includes more nitrogen than the third material.

For example, the "opening" would be the opening at the "top" of the trench or closes to where the passivation material is first introduced to the trench. In embodiments the passivation material is supplied to passivate material nearest small widths where seems are most likely to occur if all layers are grown to uniform thickness.

In an embodiment the second portion is between the first portion and a semiconductor substrate.

Another version of Example 1a. An integrated circuit system comprising: a dielectric material; a trench included in the dielectric material, the trench having first and second opposing sidewalls; wherein the trench includes: (a)(i) a first trench portion extending from the first sidewall to the second sidewall, (a)(ii) a second trench portion extending from the first sidewall to the second sidewall, and (a)(iii) a third trench portion extending from the first sidewall to the second sidewall; wherein (b)(i) the second trench portion is between the first trench portion and the third trench portion, and (b)(ii) the first trench portion is between an opening of the trench and the second trench portion; wherein the first trench portion is substantially filled with a first material, the second trench portion is substantially filled with a second material, and the third trench portion is substantially filled with a third material; wherein (c)(i) the first material includes nitrogen, and (c)(ii) the first material includes more nitrogen than the third material; wherein the second portion is between the first portion and a semiconductor substrate, the substrate being fixedly coupled to the trench with the trench being on the substrate.

As used herein, "substantially filled" means greater than 90% filled and the general lack of voids such as void 105 of FIG. 1 at any one cross-section of a gapfilled trench.

Example 2a

The system of claim 1a wherein: the first trench portion includes a first width, the second trench portion includes a second width, and the third trench portion includes a third width; and the first width is a minimum width between the first and second sidewalls in the first trench portion; the third width is a maximum width between the first and second sidewalls in the third trench portion; the first width is less than the third width.

Another version of Example 2a. The system of claim 1a wherein: the first trench portion includes a first width, the second trench portion includes a second width, and the third trench portion includes a third width; and the first width is a minimum width between the first and second sidewalls in the first trench portion; the second width is a maximum width between the first and second sidewalls in the second trench portion; the first width is less than the second width.

Example 3a

The system of claim 2a comprising an interconnect included in the trench, wherein: the trench includes an aspect ratio defined by a ratio of a depth of the trench to the third width; the aspect ratio is at least 4:1.

Example 4a

The system of claim 3a comprising a metal included in the interconnect, wherein: an axis intersects the first material and the metal; the axis does not intersect the second material.

Example 5a

The system of claim 4a wherein the axis is parallel to a long axis of the trench.

Example 6a

The system of claim 4a wherein the metal is included in one of an interconnect line, a via, and a gate of a transistor.

Example 7a

The system of claim 6a comprising: an integrated circuit; a memory; a package housing that includes the integrated circuit and the memory; wherein the integrated circuit includes the trench.

Example 8a

The system of claim 7a wherein the integrated circuit comprises a field programmable gate array (FPGA).

Example 9a

The system of claim 8a comprising a server, the server including the FPGA.

Example 10a

The system of claim 7a comprising a radiofrequency receiver.

Example 11a

The system of claim 6a comprising: an integrated circuit; a memory; a package housing that includes the integrated circuit and the memory; wherein the memory includes the trench.

Example 12a

The system of claim 4a wherein the metal is included in an interconnect line.

Example 13a

The system of claim 4a wherein the metal is included in a gate of a transistor.

Example 14a

The system of claim 3a wherein the first material further includes silicon and oxygen, the second material includes silicon and oxygen, and the third material includes silicon and oxygen.

Example 15a

The system of claim 3a wherein: the third width is between 15 nm and 80 nm; the depth is between 81 nm and 320 nm; the first portion is between the opening and a semiconductor substrate; the trench is on the semiconductor substrate.

However, in other embodiments the ranges are between 5-60 nm and 61 to 300 nm; 5-40 nm and 41-250 nm, and 25-80 nm and 81 to 300 nm.

Example 16a

The system of claim 3a wherein: the first material includes a first atomic weight percentage of nitrogen; the third material includes a third atomic weight percentage of nitrogen; the first atomic weight percentage of nitrogen is greater than the third atomic weight percentage of nitrogen.

Example 17a

The system of claim 16a wherein: the first atomic weight percentage of nitrogen is between 5.0% and 20.0%; the third atomic weight percentage of nitrogen is between 0% and 4.9%.

Example 18a

The system of claim 3a wherein the first, second, and third materials collectively include a plurality of conformal layers that conform to the first and second sidewalls.

Such conformal layers may be formed using atomic layer deposition or other conformal layer deposition process.

Example 19a

A method comprising: forming a trench in a dielectric material, the trench including an opening and first and second sidewalls that oppose one another; exposing the trench to a silicon precursor to form a first compound on the first and second sidewalls, the first compound including silicon and hydrogen; exposing the first compound to an oxidizing agent to form a second compound on upper halves of the first and second sidewalls and on lower halves of the first and second sidewalls, the second compound including silicon, oxygen, and hydrogen; exposing the second compound formed on the upper halves of the first and second sidewalls to nitrogen to form a third compound along the upper halves of the first and second sidewalls, the third compound including silicon and nitrogen; exposing the second and third compounds to the silicon precursor to form a conformal layer on the upper and lower halves of the first and second sidewalls; wherein the conformal layer includes a first portion formed on the upper halves of the first and second sidewalls and a second portion formed on the lower halves of the first and second sidewalls; wherein the first portion includes a first atomic weight percentage of nitrogen, the second portion includes a second atomic weight percentage of nitrogen, and the first atomic weight percentage of nitrogen is greater than the second atomic weight percentage of nitrogen; wherein the upper halves of the first and second sidewalls are between the opening and the lower halves of the first and second sidewalls.

Example 20a

The method of claim 19a wherein: the first portion includes a first thickness measured orthogonal to a height of the trench; the second portion includes a second thickness measured orthogonal to the height of the trench; the first thickness is less than the second thickness.

Example 21a

The method of claim 20a comprising forming additional conformal layers on the upper and lower halves of the first and second sidewalls; wherein the additional conformal layers collectively include an additional first portion formed on the upper halves of the first and second sidewalls and an additional second portion formed on the lower halves of the first and second sidewalls; wherein the additional first portion includes an additional first atomic weight percentage of nitrogen, the additional second portion includes an additional second atomic weight percentage of nitrogen, and the additional first atomic weight percentage of nitrogen is greater than the additional second atomic weight percentage of nitrogen; wherein the conformal layer and the additional conformal layers collectively substantially fill the trench in a plane, the plane including the upper and lower halves of the first and second sidewalls.

Example 22a

The method of claim 19a wherein: the upper halves of the first and second sidewalls are separated by a first minimum width; the lower halves of the first and second sidewalls are separated by a second maximum width; the first minimum width is less than the second maximum width; the first minimum width and the second maximum width are both measured orthogonal to a height of the trench; the method further comprises: (a) including the trench in an integrated circuit, and (b) including the integrated circuit and a memory in a single package.

Example 23a

An integrated circuit system comprising: a package housing that includes an integrated circuit and a memory; a substrate including a semiconductor material; an interconnect line on the substrate, the interconnect line including a metal; a material including first and second portions, the second portion being entirely between the first portion and the substrate; wherein (a)(i) a first axis intersects the interconnect line and the first portion but not the second portion; and (a)(ii) a second axis intersects the interconnect line and the second portion but not the first portion; wherein (b)(i) the substrate has a height and a width and the width is greater than the height; and (b)(ii) the first and second axes are parallel to the width of the substrate; wherein the interconnect line is included in one of the integrated circuit and the memory; wherein the first portion includes a first atomic weight percentage of nitrogen, the second portion includes a second atomic weight percentage of nitrogen, and the first atomic weight percentage of nitrogen is greater than the second atomic weight percentage of nitrogen.

Example 24a

The system of claim 23a, wherein: the package includes a field programmable gate array (FPGA); the FPGA includes the integrated circuit; the integrated circuit includes the interconnect line.

Example 1b

An integrated circuit system comprising: a dielectric material; a trench included in the dielectric material, the trench having first and second opposing sidewalls; wherein the trench includes: (a)(i) a first trench portion extending from the first sidewall to the second sidewall, (a)(ii) a second trench portion extending from the first sidewall to the second sidewall, and (a)(iii) a third trench portion extending from the first sidewall to the second sidewall; wherein (b)(i) the second trench portion is between the first trench portion and the third trench portion, and (b)(ii) the first trench portion is between an opening of the trench and the second trench portion; wherein the first trench portion is substantially filled with a first material, the second trench portion is substantially filled with a second material, and the third trench portion is substantially filled with a third material; wherein (c)(i) the first material includes nitrogen, and (c)(ii) the first material includes more nitrogen than the third material.

Example 2b

The system of claim 1b wherein: the first trench portion includes a first width, the second trench portion includes a second width, and the third trench portion includes a third width; and the first width is a minimum width between the first and second sidewalls in the first trench portion; the third width is a maximum width between the first and second sidewalls in the third trench portion; the first width is less than the third width.

Example 3b

The system of claim 2b comprising an interconnect included in the trench, wherein: the trench includes an aspect ratio defined by a ratio of a depth of the trench to the third width; the aspect ratio is at least 4:1.

Example 4b

The system according to any of claims 1b-3b comprising a metal included in the interconnect, wherein: an axis intersects the first material and the metal; the axis does not intersect the second material.

Example 5b

The system of claim 4b wherein the axis is parallel to a long axis of the trench.

Example 6b

The system according to any of claims 4b-5b wherein the metal is included in one of an interconnect line, a via, and a gate of a transistor.

Example 7b

The system according to any of claims 1b-6b comprising: an integrated circuit; a memory; a package housing that includes the integrated circuit and the memory; wherein the integrated circuit includes the trench.

Example 8b

The system of claim 7b wherein the integrated circuit comprises a field programmable gate array (FPGA).

Example 9b

The system of claim 8b comprising a server, the server including the FPGA.

Example 10b

The system of claim 7b comprising a radiofrequency receiver.

Example 11b

The system according to any of claims 1b-6b comprising: an integrated circuit; a memory; a package housing that includes the integrated circuit and the memory; wherein the memory includes the trench.

Example 12b

The system according to any of claims 1b-11b wherein the metal is included in an interconnect line.

Example 13b

The system according to any of claims 1b-11b wherein the metal is included in a gate of a transistor.

Example 14b

The system according to any of claims 1b-13b wherein the first material further includes silicon and oxygen, the second material includes silicon and oxygen, and the third material includes silicon and oxygen.

Example 15b

The system according to any of claims 2b-3b wherein: the third width is between 15 nm and 80 nm; the depth is between 81 nm and 320 nm; the first portion is between the opening and a semiconductor substrate; the trench is on the semiconductor substrate.

Example 16b

The system according to any of claims 1b-15b wherein: the first material includes a first atomic weight percentage of nitrogen; the third material includes a third atomic weight percentage of nitrogen; the first atomic weight percentage of nitrogen is greater than the third atomic weight percentage of nitrogen.

Example 17b

The system according to any of claims 16b wherein: the first atomic weight percentage of nitrogen is between 5.0% and 20.0%; the third atomic weight percentage of nitrogen is between 0% and 4.9%.

Example 18b

The system according to any of claims 1b-17b wherein the first, second, and third materials collectively include a plurality of conformal layers that conform to the first and second sidewalls.

Example 19b

A method comprising: forming a trench in a dielectric material, the trench including an opening and first and second sidewalls that oppose one another; exposing the trench to a silicon precursor to form a first compound on the first and second sidewalls, the first compound including silicon and hydrogen; exposing the first compound to an oxidizing agent to form a second compound on upper halves of the first and second sidewalls and on lower halves of the first and second sidewalls, the second compound including silicon, oxygen, and hydrogen; exposing the second compound formed on the upper halves of the first and second sidewalls to nitrogen to form a third compound along the upper halves of the first and second sidewalls, the third compound including silicon and nitrogen; exposing the second and third compounds to the silicon precursor to form a conformal layer on the upper and lower halves of the first and second sidewalls; wherein the conformal layer includes a first portion formed on the upper halves of the first and second sidewalls and a second portion formed on the lower halves of the first and second sidewalls; wherein the first portion includes a first atomic weight percentage of nitrogen, the second portion includes a second atomic weight percentage of nitrogen, and the first atomic weight percentage of nitrogen is greater than the second atomic weight percentage of nitrogen; wherein the upper halves of the first and second sidewalls are between the opening and the lower halves of the first and second sidewalls.

Example 20b

The method of claim 19b wherein: the first portion includes a first thickness measured orthogonal to a height of the trench; the second portion includes a second thickness measured orthogonal to the height of the trench; the first thickness is less than the second thickness.

Example 21b

The method according to any of claims 19b-20b comprising forming additional conformal layers on the upper and lower halves of the first and second sidewalls; wherein the additional conformal layers collectively include an additional first portion formed on the upper halves of the first and second sidewalls and an additional second portion formed on the lower halves of the first and second sidewalls; wherein the additional first portion includes an additional first atomic weight percentage of nitrogen, the additional second portion includes an additional second atomic weight percentage of nitrogen, and the additional first atomic weight percentage of nitrogen is greater than the additional second atomic weight percentage of nitrogen; wherein the conformal layer and the additional conformal layers collectively substantially fill the trench in a plane, the plane including the upper and lower halves of the first and second sidewalls.

Example 22b

The method according to any according to any of claims 19b-21b wherein: the upper halves of the first and second sidewalls are separated by a first minimum width; the lower halves of the first and second sidewalls are separated by a second maximum width; the first minimum width is less than the second maximum width; the first minimum width and the second maximum width are both measured orthogonal to a height of the trench; the method further comprises: (a) including the trench in an integrated circuit, and (b) including the integrated circuit and a memory in a single package.

The foregoing description of the embodiments of the invention has been presented for the purposes of illustration and description. It is not intended to be exhaustive or to limit the invention to the precise forms disclosed. This description and the following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An integrated circuit system comprising:
   a dielectric material;
   a trench included in the dielectric material, the trench having first and second opposing sidewalls;
   wherein the trench includes: (a)(i) a first trench portion extending from the first sidewall to the second sidewall, (a)(ii) a second trench portion extending from the first sidewall to the second sidewall, and (a)(iii) a third trench portion extending from the first sidewall to the second sidewall;
   wherein (b)(i) the second trench portion is between the first trench portion and the third trench portion, and (b)(ii) the first trench portion is between an opening of the trench and the second trench portion;
   wherein the first trench portion is substantially filled with a first material, the second trench portion is substantially filled with a second material, and the third trench portion is substantially filled with a third material;
   wherein (c)(i) the first material includes nitrogen, and (c)(ii) the first material includes more nitrogen than the third material;
   wherein (d)(i) the first trench portion includes a first width, the second trench portion includes a second width, and the third trench portion includes a third width; (d)(ii) the first width is a minimum width between the first and second sidewalls in the first trench portion; (d)(iii) the third width is a maximum width between the first and second sidewalls in the third trench portion; and (d)(iv) the first width is less than the third width.

2. The system of claim 1 comprising an interconnect included in the trench, wherein:
   the trench includes an aspect ratio defined by a ratio of a depth of the trench to the third width;
   the aspect ratio is at least 4:1.

3. The system of claim 2 comprising a metal included in the interconnect, wherein:
   an axis intersects the first material and the metal;
   the axis does not intersect the second material.

4. The system of claim 3 wherein the axis is parallel to a long axis of the trench.

5. The system of claim 3 wherein the metal is included in one of an interconnect line, a via, or a gate of a transistor.

6. The system of claim 5 comprising:
   an integrated circuit;
   a memory;
   a package housing that includes the integrated circuit and the memory;
   wherein the integrated circuit includes the trench.

7. The system of claim 6 wherein the integrated circuit comprises a field programmable gate array (FPGA).

8. The system of claim 7 comprising a server, the server including the FPGA.

9. The system of claim 6 comprising a radiofrequency receiver.

10. The system of claim 5 comprising:
    an integrated circuit;
    a memory;
    a package housing that includes the integrated circuit and the memory;
    wherein the memory includes the trench.

11. The system of claim 3 wherein the metal is included in an interconnect line.

12. The system of claim 3 wherein the metal is included in a gate of a transistor.

13. The system of claim 2 wherein the first material further includes silicon and oxygen, the second material includes silicon and oxygen, and the third material includes silicon and oxygen.

14. The system of claim 2 wherein:
    the third width is between 15 nm and 80 nm;
    the depth is between 81 nm and 320 nm;
    the first portion is between the opening and a semiconductor substrate;
    the trench is on the semiconductor substrate.

15. The system of claim 2 wherein:
    the first material includes a first atomic weight percentage of nitrogen;
    the third material includes a third atomic weight percentage of nitrogen;
    the first atomic weight percentage of nitrogen is greater than the third atomic weight percentage of nitrogen.

16. The system of claim 15 wherein:
    the first atomic weight percentage of nitrogen is between 5.0% and 20.0%;
    the third atomic weight percentage of nitrogen is between 0% and 4.9%.

17. The system of claim 2 wherein the first, second, and third materials collectively include a plurality of conformal layers that conform to the first and second sidewalls.

18. An integrated circuit system comprising:
    a package housing that includes an integrated circuit and a memory;
    a substrate including a semiconductor material;
    an interconnect line on the substrate, the interconnect line including a metal;
    a material including first and second portions, the second portion being entirely between the first portion and the substrate;
    a trench that includes the first and second portions;
    wherein (a)(i) a first axis intersects the interconnect line and the first portion but not the second portion; and (a)(ii) a second axis intersects the interconnect line and the second portion but not the first portion;
    wherein (b)(i) the substrate has a height and a width and the width is greater than the height; and (b)(ii) the first and second axes are parallel to the width of the substrate;
    wherein the interconnect line is included in one of the integrated circuit or the memory;
    wherein the first portion includes a first atomic weight percentage of nitrogen, the second portion includes a second atomic weight percentage of nitrogen, and the first atomic weight percentage of nitrogen is greater than the second atomic weight percentage of nitrogen.

19. The system of claim 18, wherein:
    the package includes a field programmable gate array (FPGA);

the FPGA includes the integrated circuit;
the integrated circuit includes the interconnect line.

20. The system of claim 18, wherein:
the material is a gapfill material;
the material includes oxygen; and
the trench is a reentrant trench.

\* \* \* \* \*